(12) United States Patent
Hebert

(10) Patent No.: US 9,864,020 B2
(45) Date of Patent: Jan. 9, 2018

(54) VERTICAL HALL SENSOR, HALL SENSOR MODULE AND METHOD FOR MANUFACTURING THE SAME

(71) Applicant: Magnachip Semiconductor, Ltd., Cheongju-si (KR)

(72) Inventor: Francois Hebert, San Mateo, CA (US)

(73) Assignee: Magnachip Semiconductor, Ltd., Cheongju-si (KR)

(*) Notice: Subject to any disclaimer, the term of this patent is extended or adjusted under 35 U.S.C. 154(b) by 120 days.

(21) Appl. No.: 14/594,499

(22) Filed: Jan. 12, 2015

(65) Prior Publication Data
US 2016/0018478 A1    Jan. 21, 2016

(30) Foreign Application Priority Data
Jul. 16, 2014 (KR) .................. 10-2014-0090099

(51) Int. Cl.
*G01R 33/07* (2006.01)
*H01L 43/14* (2006.01)
*G01R 33/00* (2006.01)
*H01L 43/06* (2006.01)

(52) U.S. Cl.
CPC ....... *G01R 33/077* (2013.01); *G01R 33/0052* (2013.01); *H01L 43/065* (2013.01); *H01L 43/14* (2013.01)

(58) Field of Classification Search
None
See application file for complete search history.

(56) References Cited

U.S. PATENT DOCUMENTS

| | | | |
|---|---|---|---|
| 4,782,375 A | 11/1988 | Popovic | |
| 4,929,993 A * | 5/1990 | Popovic | H01L 27/22 257/424 |
| 4,987,467 A | 1/1991 | Popovic | |
| 6,903,429 B2 | 6/2005 | Berndt et al. | |
| 7,205,622 B2 * | 4/2007 | Alimi | H01L 43/065 257/422 |
| 7,253,490 B2 * | 8/2007 | Oohira | G01R 33/07 257/424 |
| 7,782,050 B2 * | 8/2010 | Ausserlechner | G01R 33/07 257/427 |
| 8,426,936 B2 | 4/2013 | Minixhofer et al. | |
| 9,299,919 B1 * | 3/2016 | Lee | H01L 43/065 |
| 9,671,473 B2 * | 6/2017 | Trochut | G01R 33/072 |
| 2004/0089905 A1 * | 5/2004 | Ossipov | G01R 33/06 257/424 |
| 2007/0290682 A1 * | 12/2007 | Oohira | G01R 33/07 324/251 |
| 2009/0073615 A1 * | 3/2009 | Gurney | G01R 33/07 360/315 |
| 2011/0127583 A1 * | 6/2011 | Uhlig | G01R 33/07 257/252 |
| 2013/0342194 A1 * | 12/2013 | Motz | G01R 33/07 324/251 |

(Continued)

*Primary Examiner* — Jermele M Hollington
(74) *Attorney, Agent, or Firm* — NSIP Law

(57) ABSTRACT

A vertical Hall sensor, a Hall sensor module, and a method for manufacturing the same are provided. By applying a trench structure inside a substrate with respect to a ground terminal, a directional component parallel to surface of the substrate is maximized with respect to a current flow to detect the magnetic field with improved sensitivity.

16 Claims, 8 Drawing Sheets

(56) References Cited

U.S. PATENT DOCUMENTS

2013/0342196 A1* 12/2013 Ausserlechner ....... G01R 33/07
324/251
2016/0079344 A1* 3/2016 Agam ................... H01L 29/063
257/493

* cited by examiner

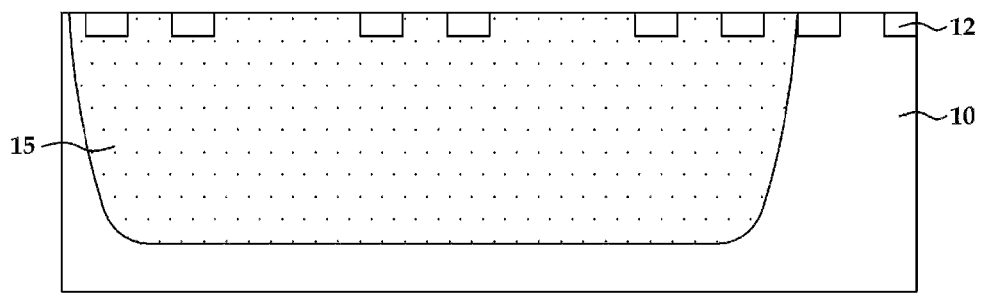
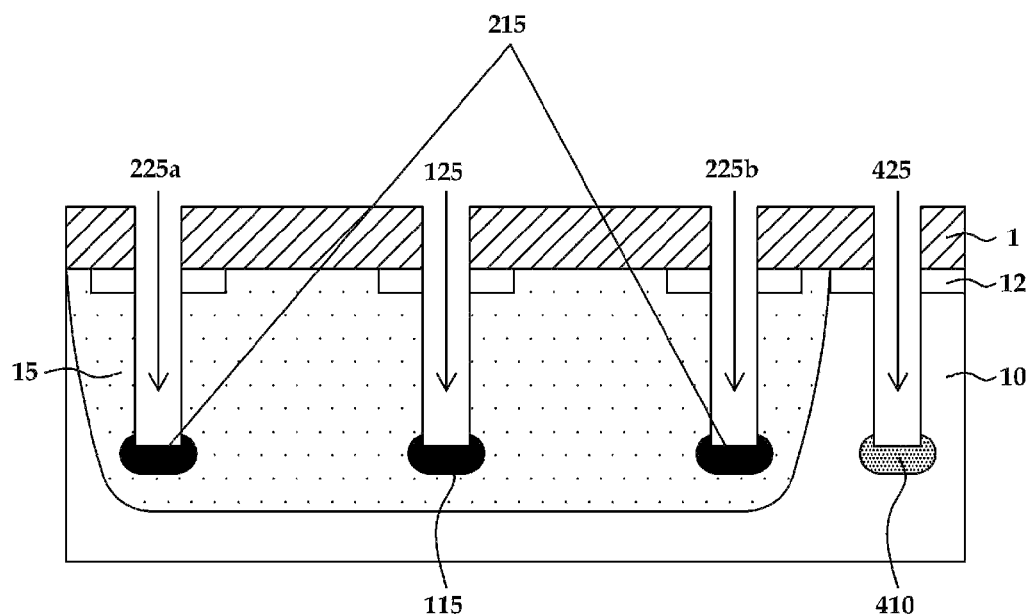

VERTICAL HALL SENSOR, HALL SENSOR MODULE AND METHOD FOR MANUFACTURING THE SAME

CROSS-REFERENCE TO RELATED APPLICATIONS

This application claims the benefit under 35 USC §119(a) of Korean Patent Application No. 10-2014-0090099 filed on Jul. 16, 2014, in the Korean Intellectual Property Office, the entire disclosure of which is incorporated herein by reference for all purposes.

BACKGROUND

1. Field

The following description relates to a vertical Hall sensor, a Hall sensor module and a method for manufacturing the same. With respect to such a sensor, by applying a trench structure inside a substrate, a directional component of a magnetic field parallel to a surface of the substrate is maximized with respect to a current flow to help the sensor detect the magnetic field.

2. Description of Related Art

A vertical Hall sensor is a Hall effect sensor enclosed within a substrate. A Hall effect sensor is a transducer that varies its output voltage in response to a magnetic field. With respect to constructing a vertical Hall sensor, providing higher sensitivity, lower manufacturing costs, availability of an Integrated circuit (IC) and the capability of successfully detecting a magnitude of the magnetic field parallel to a surface of a die are useful aspects of such a sensor.

Such a vertical Hall sensor requires more than five contacts. Specifically, one power input contact for positive power, two left/right sensing contacts, or electrodes, and two ground contacts for negative power are required. In such a structure, a current path formed between the input contact and the ground contacts is easily bent in accordance with the magnitude of the ambient magnetic field. Specifically, the above described vertical Hall sensor is designed to detect and measure the operating current Is that changes according to the ambient magnetic field in order to thereby detect and measure the ambient magnetic field. The detector basically detects changes in current flow resulting from an applied external magnetic field, through measuring a change in voltage received at the sensing contacts.

With reference to a typical vertical Hall sensor, the operating current between the input contact and two ground contacts includes a vertical current component and a horizontal current component. The vertical current component causes the accuracy to be degraded in detecting a direction and a magnitude of the magnetic field, because changes in vertical current flow do not necessarily result in a change in the voltages present at the sensing electrodes.

To address these issues, various methods are proposed to develop a vertical Hall sensor in which a magnitude of a vertical current component is minimized and a magnitude of a horizontal current component is maximized. By doing so, the accuracy of such a vertical Hall sensor is improved.

Other vertical Hall sensors generally have most of the current paths being formed at the surface, or near the surface, of the substrate. This design approach results in reduced sensitivity because of interface charges typically present at the sensor surface, between the semiconductor surface and overlying dielectric films. In an effort to resolve such issues, many methods of additionally forming a depletion region of a certain depth from the surface of the substrate and implementing an additional heat treatment with respect to dopants in order to expand the depletion region are employed. However, such methods result in the increase of costs for manufacturing a vertical Hall sensor that employ these methods.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a vertical Hall sensor includes a first conductivity type substrate, an input terminal including a first conductivity type input contact region situated inside the substrate, wherein the input contact region is electrically connected to an input power source, a first ground terminal and a second ground terminal, each including trenches spaced apart from each other by an interval with the input terminal being at their center, an insulating layer disposed along the sidewalls of the trenches, and a first conductivity type ground contact region situated at bottoms of the trenches and electrically connected to a ground power source, and a first sensing terminal and a second sensing terminal, each including a first conductivity type sensing contact region, situated between the input terminal and the first output terminal and between the input terminal and the second output terminal in the substrate, respectively, wherein the sensing contact regions are configured to detect a Hall voltage.

The input terminal may further include a trench having a depth, and a conductor formed inside the trench, and wherein the input contact region is formed at a bottom of the trench of the input terminal.

A depth of the trench of the input terminal may be equal to or less than that of the trenches of the first ground terminal and the second ground terminal.

The first sensing terminal and the second sensing terminal may each further include a trench having a depth and an insulating layer disposed along the sidewalls of the trench, and the sensing contact regions of the first sensing terminal and the second sensing terminal may be formed at bottoms of the trenches of the first sensing terminal and the second sensing terminal, respectively.

Depths of the trenches of the first sensing terminal and the second sensing terminal may be equal to or less than depths of the trenches of the first ground terminal and the second ground terminal.

Trenches of the first ground terminal and the second ground terminal may be aligned in a ring structure.

The vertical Hall sensor may further include an isolation ground ring surrounding peripheries of the first ground terminal and the second ground terminal.

The vertical Hall sensor may further include an interlayer insulating layer disposed on the substrate and contact plugs electrically connected to the input contact region, the ground contact regions, and the sensing contact regions, respectively.

The vertical Hall sensor may further include a first field isolation layer disposed between the input terminal and the first sensing terminal and the input terminal and the second sensing terminal, and a second field isolation layer disposed between the first sensing terminal and the first ground terminal and the second sensing terminal and the second ground terminal.

The vertical Hall sensor may further include a sensing region that is a second conductivity type well disposed inside the substrate, wherein the input contact region, the ground contact regions and the sensing contact regions are formed in the second conductivity type well sensing region.

The vertical Hall sensor may further include a high concentration second conductivity type buried layer inside the substrate, wherein the input contact region, the ground contact regions, and the sensing contact regions are formed in the high concentration second conductivity type buried layer.

The vertical Hall sensor may have a linear structure, a cross structure, or a bull's eye concentric round structure.

In another general aspect, a vertical Hall sensor includes a first conductivity type substrate, an input terminal including a trench having a first depth, a conductor formed inside the trench, an insulating layer disposed along the sidewalls of the trench, and a first conductivity type input contact region situated at a bottom of the trench and electrically connected to an input power source, a first ground terminal and a second ground terminal each including a trench having a second depth, an insulating layer disposed along the sidewalls of the trench, and a first conductivity type ground contact region situated at a bottom of the trench and electrically connected to a ground power source, wherein the trenches are spaced apart from each other by an interval with the input terminal being their center, and a first sensing terminal and a second sensing terminal each including a trench having a third depth, an insulating layer disposed along the sidewalls of the trench, and a first conductivity type sensing contact region situated at a bottom of the trench, and configured to detect a Hall voltage.

The first depth, second depth, and third depth may be the same depth.

The first depth may be the same as the second depth, and may be greater than the third depth.

The third depth may be greater than the first depth, and less than the second depth.

In another general aspect, a method for manufacturing a vertical Hall sensor includes disposing an input trench having a first depth and ground trenches having a second depth and spaced apart from each other by an interval with the input trench being their center in the first conductivity type substrate, disposing a first conductivity type contact region at bottoms of the input trench and the ground trenches, disposing an insulating layer along the sidewalls of the input trench and the ground trenches, disposing a conductor inside of the input trench and the ground trenches, disposing a first conductivity type sensing contact region between the input trench and the ground trenches in the substrate, disposing an interlayer insulating layer on the substrate, and disposing a contact plug electrically connected to each contact region in the interlayer insulating layer.

The method may further include disposing a high concentration second conductivity type buried layer in the substrate, and disposing a low concentration second conductivity type sensing region in the substrate.

In another general aspect, a vertical Hall sensor includes a substrate, an input terminal including an input contact region electrically connected to an input power source situated inside the substrate, a first ground terminal and a second ground terminal, each including trenches spaced apart from each other with the input terminal being at their center, an insulating layer disposed along the sidewalls of the trenches, and a ground contact region situated at bottoms of the trenches and electrically connected to the ground power sources, and a first sensing terminal situated between the input terminal and the first output terminal and a second sensing terminal between the input terminal and the second output terminal in the substrate, each including a sensing contact region configured to detect a Hall voltage.

The substrate, the input contact region, the ground contact regions, and the sensing contact regions may all be of a first conductivity type.

Other features and aspects will be apparent from the following detailed description, the drawings, and the claims.

BRIEF DESCRIPTION OF THE DRAWINGS

FIGS. 12A, 12B, 12C and 12D are diagrams illustrating an example of a method for manufacturing a vertical Hall sensor.

Figure 1:
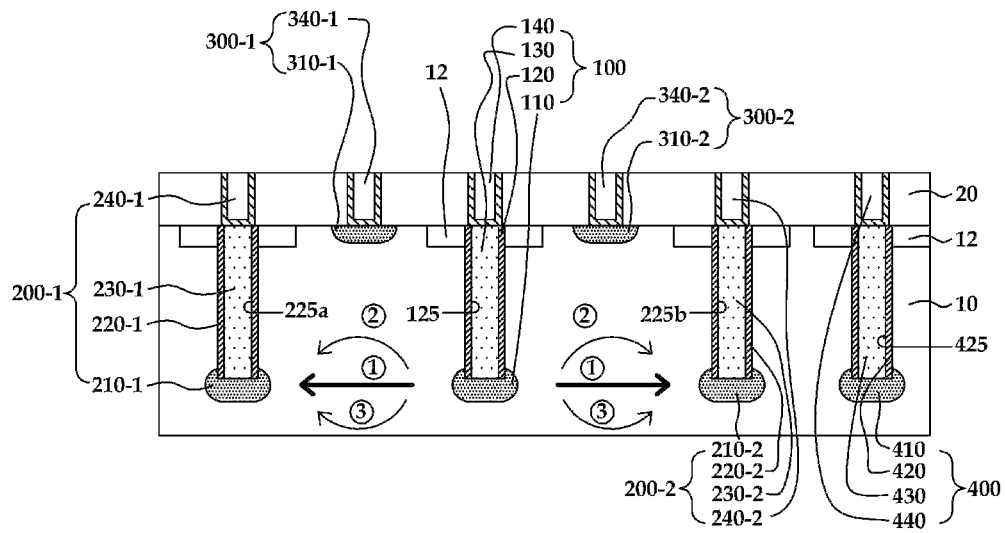
FIG. 1 is a diagram illustrating an example of a vertical Hall sensor.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The spatially-relative expressions such as "below", "beneath", "lower", "above", "upper", and the like are used to conveniently describe relationships of one device or elements with other devices or among elements. The spatially-relative expressions are to be understood as encompassing the direction illustrated in the drawings, added with other directions of the device in use or operation. Further, the device is potentially oriented towards other directions and accordingly, the interpretation of the spatially-relative expressions is based on the relevant orientation.

FIG. 1 is a diagram illustrating an example of a vertical Hall sensor.

As illustrated in the example of FIG. 1, the vertical Hall sensor includes a P-type substrate 10, an input terminal or electrode 100 situated in a perpendicular orientation to a surface of the substrate 10, two ground terminals or electrodes 200 and two sensing terminals 300. An interlayer insulating layer 20 is disposed on the substrate to facilitate the operation of the device. For example, the input terminal 100, the two ground terminals 200, and the two sensing terminals 300, are situated in the contact plugs 140, 240 and 340 that are electrically connected with interlayer insulating layer 20.

The input terminal 100 of the vertical Hall sensor described in the present example is formed in a trench structure. Specifically, in the present example, the input terminal 100 includes a trench 125 situated at a certain depth, an insulating layer 120 disposed on the sidewalls of the trench 125, and an input contact region of a P-type 100 disposed at a bottom of the trench 125. The input contact region 110 is present in a deep junction structure of a P-type situated at the bottom of the trench 125. A conductor 130 is possibly formed inside the trench 125. With respect to the conductor 130, doped polysilicon may be used for the conductor 130. In an example, the doping of the doped polysilicon is the same as that used in the highly doped junction at the bottom of the trench or trenches. The insulating layer 120 is disposed at the side of the trench, but not disposed at the bottom of the trench. Therefore, it is possible that the input contact region 110 is electrically connected to the conductor 130 because of this structural aspect. Further, according to this example, the input terminal 100 includes a contact plug 140 electrically connected to the input contact region 110 so that the input contact region 110 is connected to appropriate input power sources. In examples, contact plug 140 is formed of a barrier layer, not shown, formed of Titanium Nitride (TiN) and Tungsten (W). One method to form the input contact region 110 is implanting dopants at a doping concentration higher than that of the substrate. For example, the dopants may include substances such as boron (B), boron difluoride ($BF_2$), indium (In), gallium (Ga) that are P-type dopants. However, this list is not meant to be limiting and other appropriate dopants may also be used in other examples.

Doping refers to intentionally introducing small amounts of impurities into an extremely pure semiconductor to change its electrical properties, due to excess electrons or deficits in electrons. Here, the dopant and the concentration of the dopant are chosen so as to be suitable to facilitate electrical connections with the vertical Hall sensor.

The input contact region 110 is disposed under the deep trench structure starting from the surface of the substrate, such that it is considered to be a recessed contact region. Due to the formation of the input contact region inside the substrate, a current flow does not occur at the surface but instead occurs below the surface. Therefore, a current path avoids influences from surface effects.

Two ground terminals 200 are spaced apart from each other by a certain interval with the input terminal 100 being situated in the center of the interval. For example, the ground terminal 200 includes trenches 225a and 225b situated at a certain depth, an insulating layer 220 disposed along the sidewalls of the trenches 225a and 225b and a ground contact region of a P-type 210 disposed at the bottoms of the trenches 225a and 225b. Additionally, in this example, a conductor 230 is formed additionally inside the trenches 225a and 225b. In this example, the ground contact region 210 is formed by implanting dopants at a doping concentration higher than that of the substrate, for example, boron (B), indium (In), gallium (Ga) that are a P-type dopant. However, this list is not meant to be limiting and other appropriate dopants may also be used in other examples. Additionally, the ground contact region 210 is electrically connected to the additional ground power sources and connections. To this end, in an example, the ground terminal 200 additionally includes a contact plug 240 connected to the ground contact region 210.

Two sensing terminals 300 are spaced apart from each other by a certain interval with the input terminal 100 being present at their center, where one sensing terminal 300-1 is situated between the input terminal 100 and the first ground terminal 200-1 and another sensing terminal 300-2 is situated between the input terminal 100 and the second ground terminal 200-2. It is preferable to dispose each sensing terminal 300 at the center between the input terminal 100 and each of the ground terminals 200. However, the sensing terminals 300-1 and 300-2 could also be located closer to the input terminal 100, or closer to the ground terminals 200-1 and 200-2 depending on the desired sensitivity for the sensor as a whole. The sensing terminal 300 includes a P-type sensing contact region 310 disposed inside the substrate 10. The sensing contact region 310 detects a Hall voltage generated in accordance with the current that flows between the input contact region 110 and each ground contact region 120. In this example, the sensing terminal 300 further includes the contact plug 340 electrically connected to the sensing contact region 310. In an another example, the sensing contact region 310 is formed by implanting dopants at a doping concentration higher than that of the substrate, for example, boron (B), indium (In), gallium (Ga) that are a P-type dopant. Again, this list is not meant to be limiting and other appropriate dopants may also be used in other examples. The sensing contact region 310 acts as a sensing point. In this example, the sensing contact region 310 is possibly formed at the surface of the substrate or at a region deeper than the surface of the substrate in some examples.

In some examples, at both ends of the input terminal 100 a shallow isolation layer 12 that is shallower than the trench 125 is disposed. In some examples, with respect to the shallow isolation layer 12, a Shallow Trench Isolation (STI), or a local oxidation of silicon (LOCOS) oxide layer is used. In some examples, at both ends of each ground terminal 200, a shallow isolation layer 12 is disposed. In such examples, the above discussed Shallow Trench Isolation (STI) or the LOCOS is used with respect to the shallow isolation layer.

When the input terminal 100 and two ground terminals 200 are connected to each of the input power sources and ground power sources appropriate, various types of voltages are generated at the sensing electrodes as a result of bending of the current flow between the input electrode and the two ground electrodes, according to the applied ambient external magnetic field, as illustrated in the example of FIG. 1. In one situation, where there is no component of a magnetic field that is parallel to a surface direction of the substrate 10, the flow of the current applied from the input terminal 100 to each ground terminal 200 is horizontal on both sides of the input electrode, as illustrated by reference numeral ①, because the current is not bent by any magnetic field. On the other hand, in a second situation or a third situation, where there is a component of a magnetic field parallel to the surface of the substrate 10, the flow of the current between the input terminal to each ground terminal is, as illustrated by reference numeral ② or ③, curved by the impact of the magnetic field. The current path scenarios ①, ②, and ③ are such that the sensor is designed such that the horizontal component of a current path is greater than the vertical component of a current path. Thus, examples achieve improved sensing performance when compared to that of the conventional art.

As described, in examples the current formed between the input terminal 100 and each ground terminal 200 is not formed at the surface of the substrate 10. Thus, an additional surface depletion, otherwise used to push the current flow away from surface interfaces, is not used in examples. Further, an insulating layer 220 is disposed at the sides of the ground terminal 200. Therefore, the occurrence of a parasitic current is prevented. In other words, there is no current flow from the sidewalls of any of the trenches that have sidewall insulators.

The vertical Hall sensor of the present examples optionally further includes an isolation ground ring 400 surrounding peripheries of the above-described structures. Specifically, such an isolation ground ring 400 advantageously acts to secure and safeguard the operating characteristics of the sensor by isolating the structures that include an input terminal 100, two ground terminals 200 and two sensing terminals 300 from other structures and acts to transfer a voltage having a particular potential to the substrate.

The isolation ground ring 400 is a means to electrically contact the substrate 10. It includes a trench 425 situated at a certain depth, an insulating layer 420 disposed on the sidewalls of the trench 425, a conductor 430 disposed inside the trench, and a contact plug 440 including a substrate contact region 410 disposed at the bottom of the trench, situated in the interlayer insulating layer 20 and also electrically connected to the conductor 430. Further, the isolation ground ring 400 acts to electrically isolate the other structures, described previously, from peripheral devices.

Referring to FIG. 1, the isolation ground ring 400 is situated at a right side of the structures that include the input terminal 100, two ground terminals 200 and two sensing terminals 300, for illustration purposes. However, in examples, the isolation ground ring 400 is disposed so as to surround the peripheries of the structures, as having a ring shape.

The vertical Hall sensor described as above includes an input terminal 100, a ground terminal 200, and a sensing terminal 300, situated inside the substrate 10 and having a trench structure. The trench structure is constructed such that an insulating layer is disposed on the sidewalls of the trenches and a contact point to detect the magnetic field is thereby situated inside a silicon substrate. Accordingly, a current flow used to detect the magnetic field does not flow at a surface of the substrate. Thus, an additional surface depletion is not used and a sensing effect is also improved.

Figure 2:
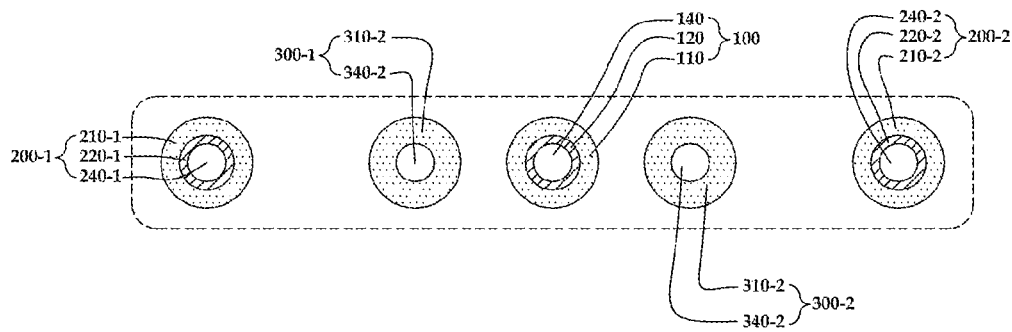
FIG. 2 is a diagram illustrating an example of a top view of a vertical Hall sensor module.

FIG. 2 is a diagram of an example illustrating a top view of a vertical Hall sensor. In this example, an input terminal 100, ground terminals 200, and sensing terminals 300 are provided having a linear type arrangement. A trench for input voltage, a trench for ground, and two trenches for sensing are provided, each having a pillar shape, in a linear arrangement.

Figure 3:
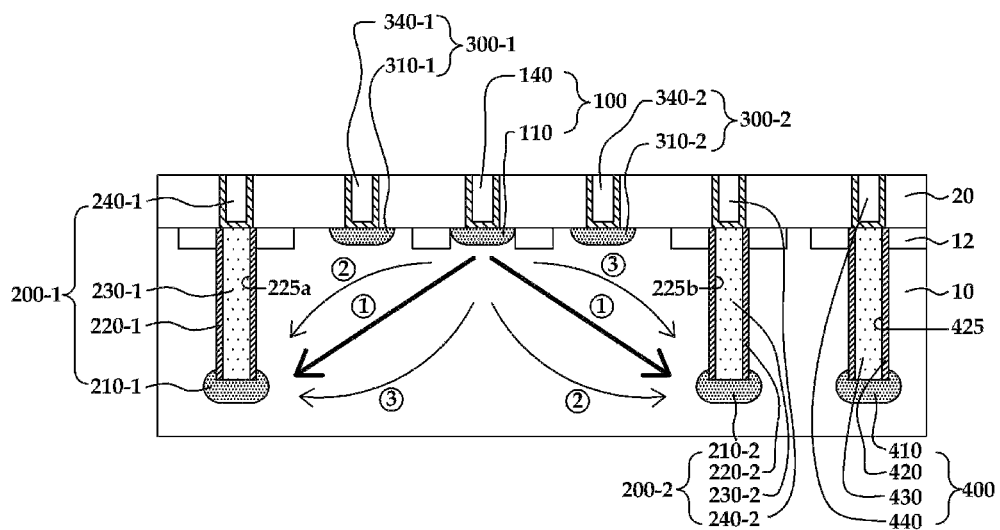
FIG. 3 is a diagram illustrating an example of a vertical Hall sensor.
Figure 4:
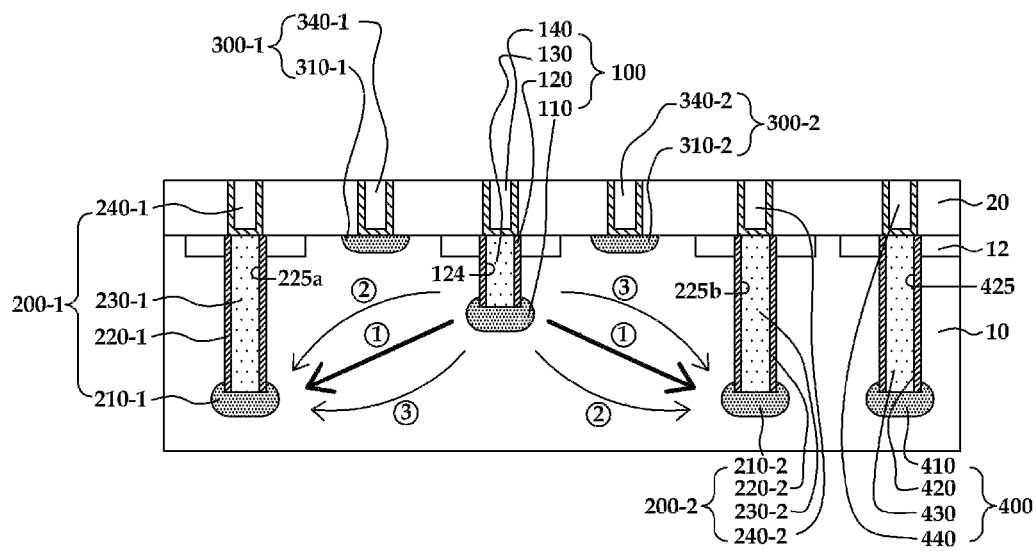
FIG. 4 is a diagram illustrating an example of a vertical Hall sensor.

Referring to FIGS. 3 and 4, a vertical Hall sensor according to another example is illustrated.

In the example of the FIG. 3, the input terminal 100 is disposed at a surface of the substrate 10, but without a trench structure, being disposed in a similar manner to that of the sensing terminals 300. The ground terminals 200 and the isolation ground ring 400 are still provided in a trench structure. However, the flow of the current generated by such a structure is still able to remain in an oblique direction, such that the flow of current is not influenced by the defects and parasitic charges of the surface and overlying dielectric films.

As illustrated in the example of FIG. 4, the input terminal 100 of the vertical Hall sensor is a trench 124 having a depth that is shallower than the depth of the trench 125 of the input terminal 100 illustrated in the example of FIG. 1 so as to have a mid-point contact. In such an example, a depth of trench 124 for the input terminal 100 is potentially shallower than that of the trenches 225a and 225b of the ground terminal 200 disposed around the input terminal 100. The input terminal optionally includes an insulating layer 120 disposed on the sidewalls of the trench 124 and an input contact region of a P-type 110 that is situated at the bottom of the trench 124. Additionally, a conductor 130 is optionally situated inside the trench. As discussed with reference to FIG. 4, a depth of the trench 124 of the input terminal 100 optionally varies in accordance with a desired current path.

Figure 5:
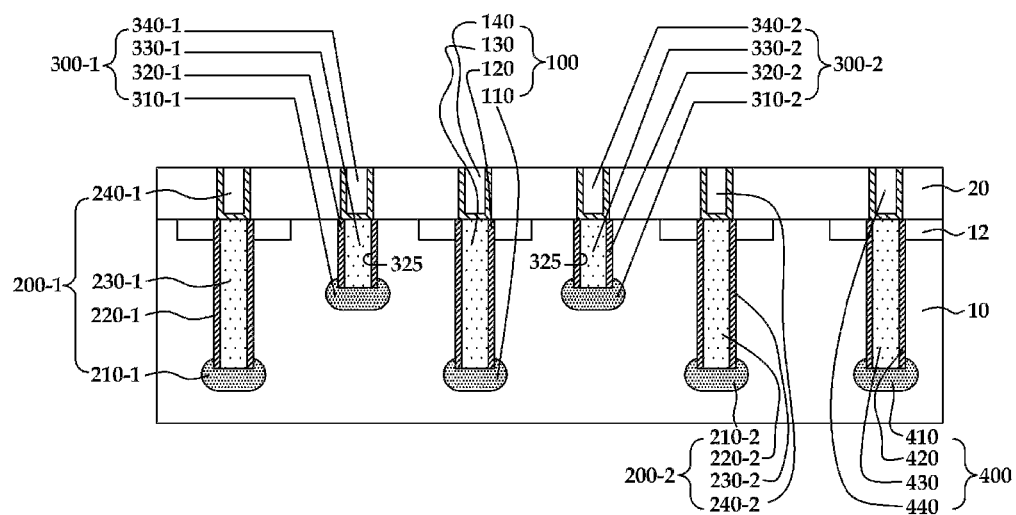
FIG. 5 is a diagram illustrating an example of a vertical Hall sensor having a recessed sensing contact structure.

FIG. 5 is a diagram illustrating an example of a vertical Hall sensor having a recessed sensing contact structure.

As illustrated in the example of FIG. 5, sensing terminals 300 are provided in a trench structure.

In examples, each sensing terminal 300 includes a trench 325 situated at a certain depth, an insulating layer 320 disposed on the sidewalls of the trench 325, and a sensing contact region of a P-type 310 that is disposed at the bottom of the trench 325. For example, a conductor 330 is optionally situated inside the trench 325. As a result, unlike in the configuration of the preceding examples, a sensing contact region 310 is formed at a location that is situated deeper from the substrate surface. Therefore, the sensing contact region 310 senses the magnetic field without the influence occurring due to the substrate surface. As a result, a further improvement to the sensing capability for the magnetic field is obtained.

For example, the trench 325 of the sense 300 is situated at various depths in various examples. As illustrated in the example of FIG. 5, the trench 325 is formed at a depth that is shallower than that of the trenches of the input terminal 100 and the ground terminal 200. However, unlike in the example of FIG. 5, in another example the trench is optionally formed at the same depth as the trench of the input terminal 100 and the ground terminal 200.

Hence, there are variations with the different trench combinations and various trench configurations. For example, the combinations include configurations featuring a same trench depth for input and ground and sensing electrodes, a same trench depth for input and ground electrodes, but shallower trench depths for the sensing electrodes, deeper trenches for the ground electrodes, a shallower trench for the input electrode, and no trenches for the sensing electrodes, or deeper trenches for the ground electrodes, shallower trenches for the sensing electrodes, and a shallow trench for the input electrode. However, these are only examples and potential examples include any appropriate combination of depths, where the examples are configured to operate while taking into account the effects of the depths of the various electrodes on the properties of the sensor.

Figure 6:
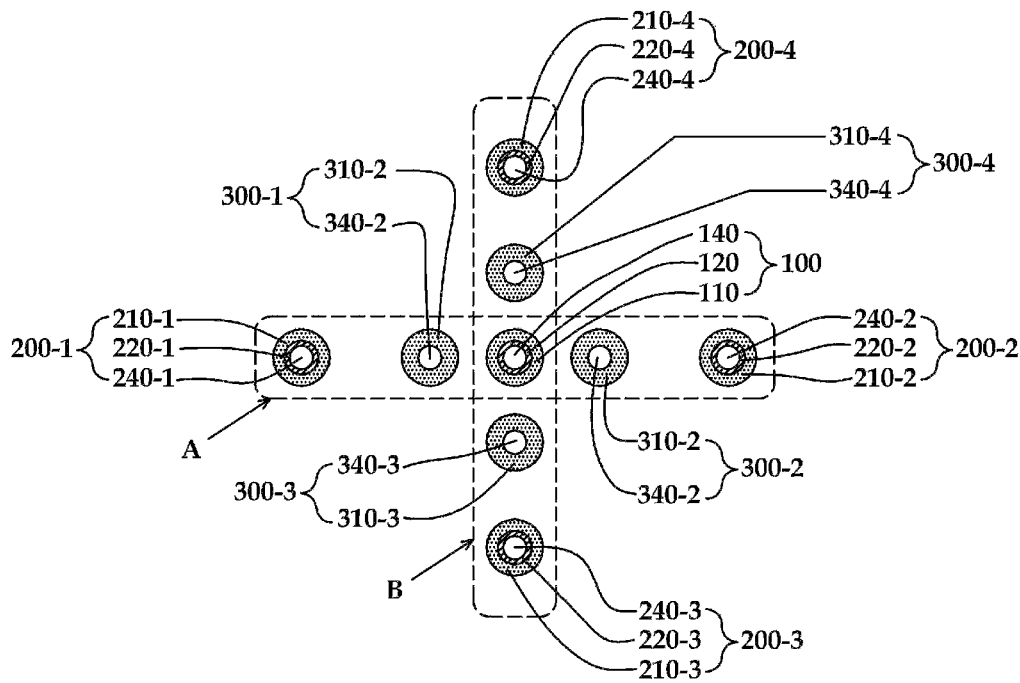
FIG. 6 is a diagram illustrating an example of a top view of a Hall sensor module.

FIG. 6 is a diagram illustrating an example of a top view of a Hall sensor module.

As illustrated in the example of FIG. 6, the Hall sensor module is configured such that two vertical Hall sensors (A, B) are provided in a cross structure with respect to one another, with the input terminal 100 being their intersection point. In other words, with the input terminal 100 being situated at their center, each ground terminal 200 and sensing terminal 300 is disposed in up, down, left, and right directions. Thus, the ground terminal 200 and sensing terminal 300 forms the cross-shaped structure shown from above in the example of FIG. 6.

As illustrated in the example of FIG. 6, the input terminal 100 and four ground terminals 200 are provided in a trench structure. Along the sidewalls of the trenches, insulating layers 120 and 220 are disposed. Four sensing terminals 300 are not provided in a trench structure, but for the sensing terminals 300, the sensing contact region 310 is disposed inside the substrate 10. Thus, the trench structure with respect to the input terminal 100 and ground terminal 200, in examples is realized as illustrated in the examples of FIG. 1 or 4, as discussed previously. Further, as illustrated in the example of FIG. 5, the sensing terminal 300 is also optionally applied to the vertical Hall sensor having the trench structure.

Figure 7:
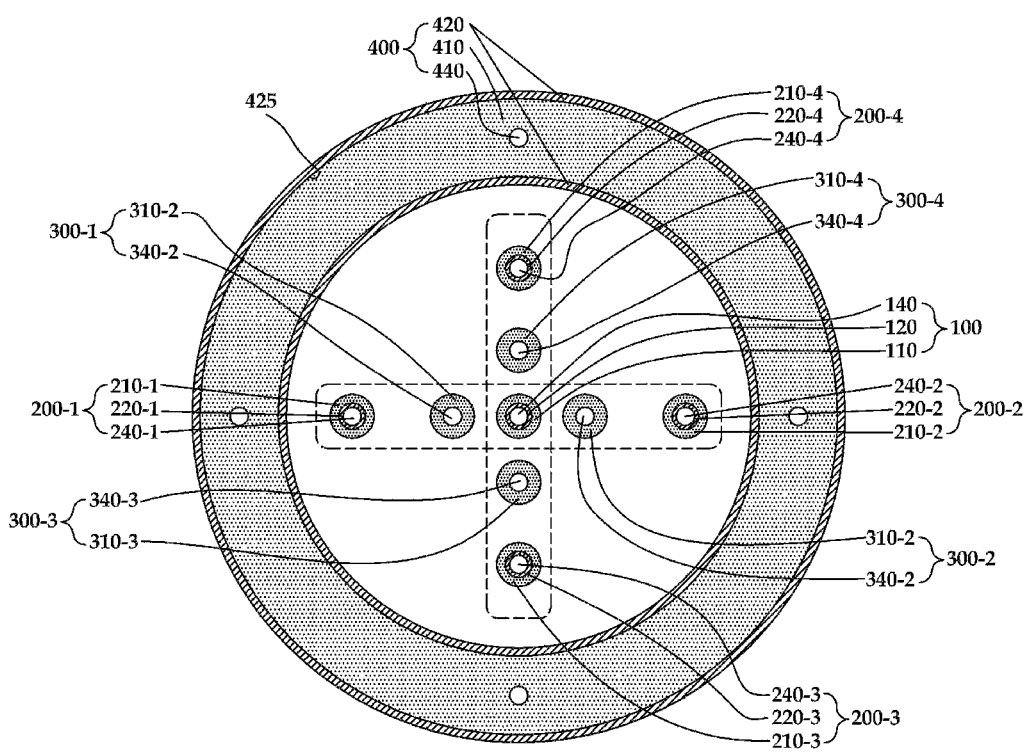
FIG. 7 is a diagram illustrating an example of a top view of a Hall sensor module.
Figure 8:
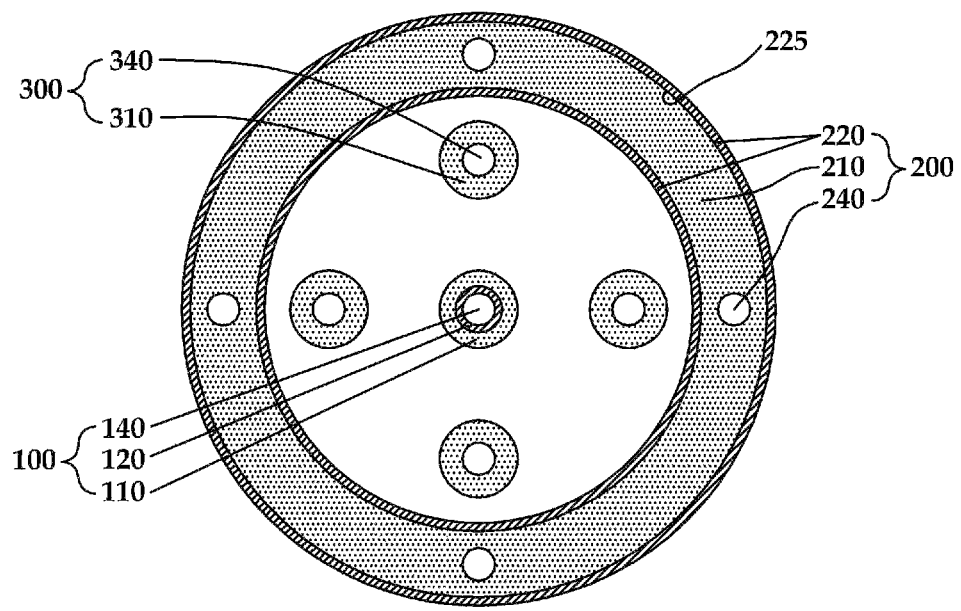
FIG. 8 is a diagram illustrating an example of a top view of a Hall sensor module.

FIGS. 7 and 8 are diagrams illustrating an example of a top view of a Hall sensor module.

Referring first to FIG. 7, the Hall sensor module further includes an isolation ground ring 400 surrounding the peripheries of the structures illustrated in the example of FIG. 6. In the example of FIG. 7, the isolation ground ring 400 includes a trench in a ring shape 425, an insulating layer 420 disposed at both sides of the trench 425, that is, an inner surface and an outer surface, a substrate contact region 410 disposed at the bottom of the trench 425, a conductor 430 disposed inside the trench 425, and a contact plug 440 electrically connected to the conductor.

In the example of FIG. 8, four ground terminals 200 are configured to be connected to each other in an example having the trench structure 225 in a ring shape. Furthermore, the trenches are also potentially formed in a linear fashion, that is, formed in the shape of a straight line. The input terminal 100 becomes a terminal of both poles. Also, the ground terminal 200 has a deep trench structure in a ring shape, and becomes a deep trench negative terminal ring electrode. The vertical Hall sensor may have various arrangements. For example, the vertical Hall sensor in one example takes on a "Bull's Eye" concentric round type structure or in another example takes on a "Dart Board" type structure. Such a Hall sensor module in a ring shape, in an example includes a trench 225 in a ring shape; an insulating layer disposed at both sides of the trench 225, that is, an inner surface and an outer surface, a ground contact region 210 disposed at the bottom of the trench 225, a conductor 230 disposed inside the trench 225, and a contact plug 240 electrically connected to the conductor 230. In this example, the example does not use an additional isolation structure. The example operates without the use of an additional isolation structure because the ground terminal 200 is arranged to act in a ring shape while simultaneously replacing the isolation structure.

Further, unlike in the preceding examples, the vertical Hall sensor optionally includes, in some other examples, an input terminal 100; two ground terminals 200 and two sensing terminals 300 where the terminals respectively have a contact region composed of an N-type material. In such an example, the individual contact region of an N-type material is disposed at a well region of an N-type. This example is discussed with reference to FIGS. 9 and 10.

Figure 9:
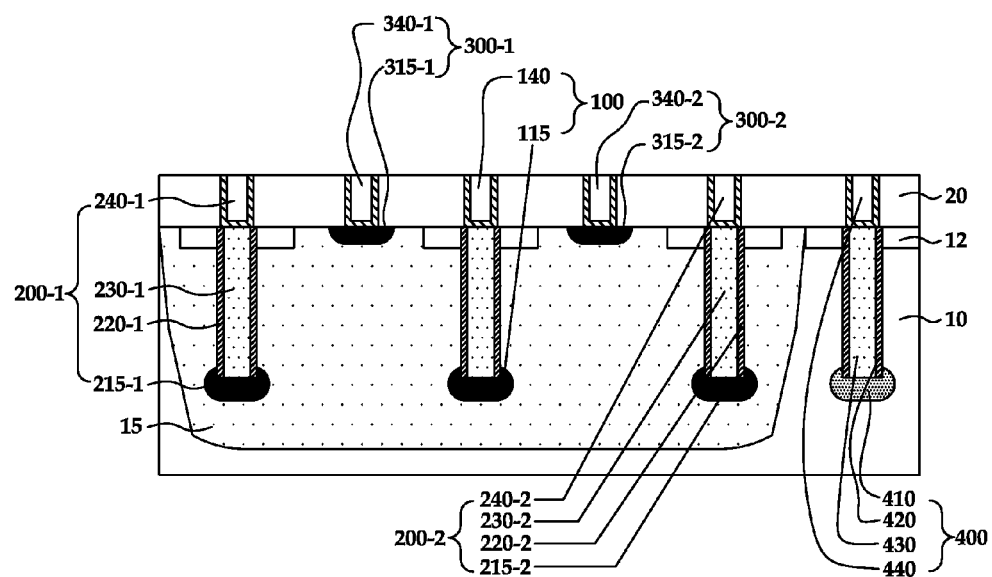
FIG. 9 is a diagram illustrating an example of a vertical Hall sensor.
Figure 10:
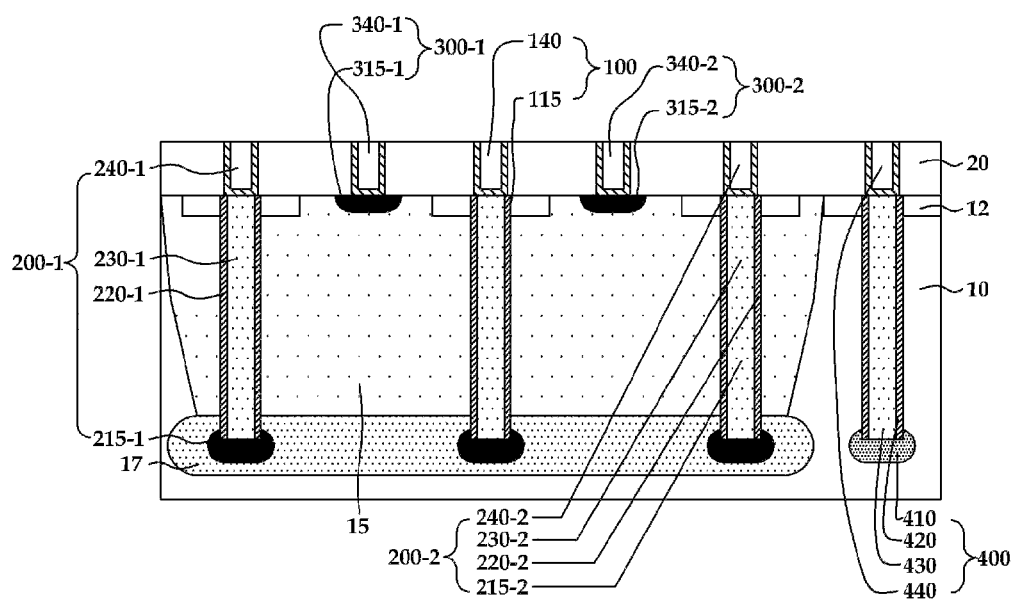
FIG. 10 is a diagram illustrating an example of a vertical Hall sensor.

FIGS. 9 and 10 are diagrams illustrating an example of a vertical Hall sensor.

Referring to FIG. 9, the vertical Hall sensor includes a P-type substrate 10, a sensing region 15 that is an N-type well disposed inside the P-type substrate 10, an input electrode 100 that includes N-type contact regions 115, 215 and 315, and two ground terminals 200, and two sensing terminals 300. The input terminal 100, two ground terminals 200, and two sensing terminals 300 are identical to the examples of FIGS. 2 to 9 except for the technical feature in which the N-type contact regions 115, 215 and 315 are provided wherein the N-type contact regions are disposed inside the N-type well sensing region 15. Thus, the detailed description of these elements is omitted for brevity. Here, the isolation region 400 is configured to form an electrical connection with the P-type substrate 10 and is also disposed at an outer region of the sensing region 15 that is an N-type conductor well.

A retrograded well formed by implanting dopants, such as phosphorus (P) or arsenic (As), which are N-type dopants, is applied with respect to the N-type well sensing region 15. However, these are merely examples, and other appropriate N-type dopants are used in other examples. At the bottom surface of the substrate, the higher concentration of dopant is observed than the dopant concentration in the surface of the substrate. The N-type well sensing region 15 may also be an N-type Epitaxial layer. Alternatively, a diffused well formed by implanting N-type dopants is possibly used. In another example, the contact regions 115, 215, and 315 of the input terminal 100, two ground terminals 200, and two sensing terminals 300 are formed by implanting dopants, such as phosphorus (P), arsenic (As), or other appropriate dopants, as discussed above. Such an example forms the contact regions 115, 215 and 315 by implanting dopants at a doping concentration higher than in the sensing region 15, and as a result minimizes contact resistance. Also, in this example, depths of the trenches of the input terminal, ground terminal, and sensing terminal are configured to be smaller than the depth of the N-type well.

Also, as illustrated in the example of FIG. 10, the vertical Hall sensor further includes an N-type buried region 17.

In the example of FIG. 10, the N-type buried region 17 includes all of the input contact region 110, two ground terminals 200, and the ground contact region 210 of the input terminal 100. Thus, in this example, the influences of the current generated from the input contact region 110 with respect to each ground contact region 210 are minimized with respect to the surface of the substrate. As a result, the sensing reliability is improved. Further, the current path is formed for the N-type buried region 17, so that more horizontal currents are constrained by the N-type buried region 17. Accordingly, the sensitivity of the sensor increases. The N-type buried region 17 is disposed under or alternatively at or near the bottom of, the N-type well region 15 and is doped at a concentration higher than the N-type well region 15. Here, the isolation region 400 is provided for an electrical connection with the P-type substrate 10 and is disposed at an outer region of the N-type well sensing region 15 and the N-type buried region 17.

FIGS. 11A, 11B, 11C and 11D are diagrams illustrating an example of a method for manufacturing the vertical Hall sensor. These diagrams illustrate sequential stages for the manufacturing process.

Figure 11A:
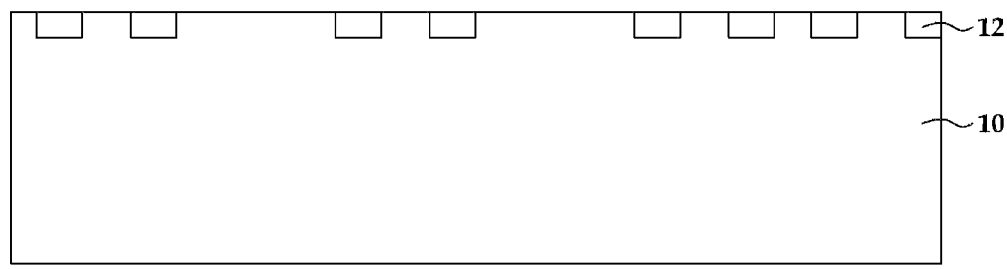
FIGS. 11A, 11B, 11C and 11D are diagrams illustrating an example of a method for manufacturing a vertical Hall sensor.

As illustrated in the example of FIG. 11A, a P-type substrate 10 is prepared. In the example of FIG. 11A, the P-type substrate 10 also includes a shallow device isolation layer 12, also referred to as a field isolation layer. For example, the shallow device isolation layer 12 includes a Shallow Trench Isolation (STI) and a local oxidation of silicon (LOCOS) oxide layer. The STI and the LOCOS are not to be limited by the particular forming process, and other appropriate types of shallow device isolation layer 12 are used in the context of other examples.

Figure 11B:
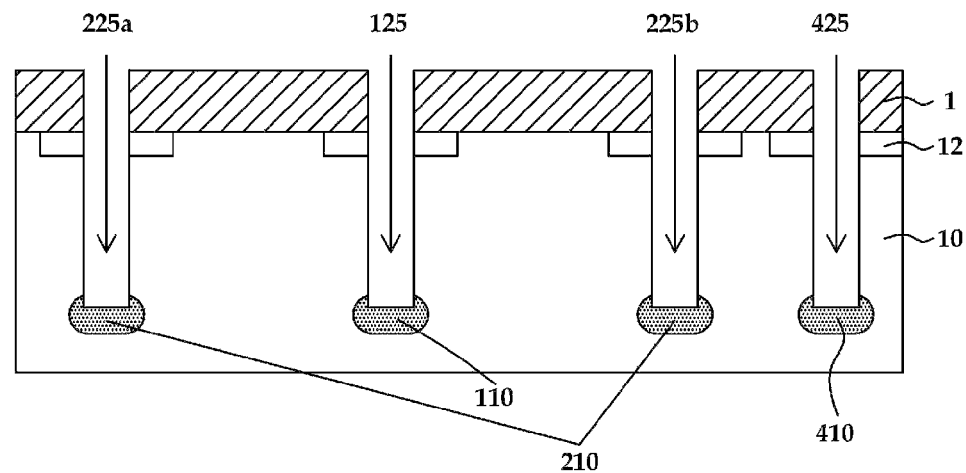

As illustrated in the example of FIG. 11B, by forming a trench mask 1 on the P-type substrate 10, an input trench 125 and two ground trenches 225a and 225b are situated with a certain depth on the substrate 10. In some examples, a trench 425 that forms an isolation structure is additionally disposed at an outer region of the two ground trenches, based on the above process. Also, some examples provide that various trenches are formed by means of one mask. In such examples, manufacturing costs are reduced accordingly.

Referring again to the example of FIG. 11B, an input trench 125 of the input terminal 100 is situated at the same depth as that of ground trenches 225a and 225b of the two ground terminals 200. In some examples, the input trench 125 is situated at a depth different from that of the ground trenches 225a and 225b by using a supplementary trench mask.

Figure 11C:
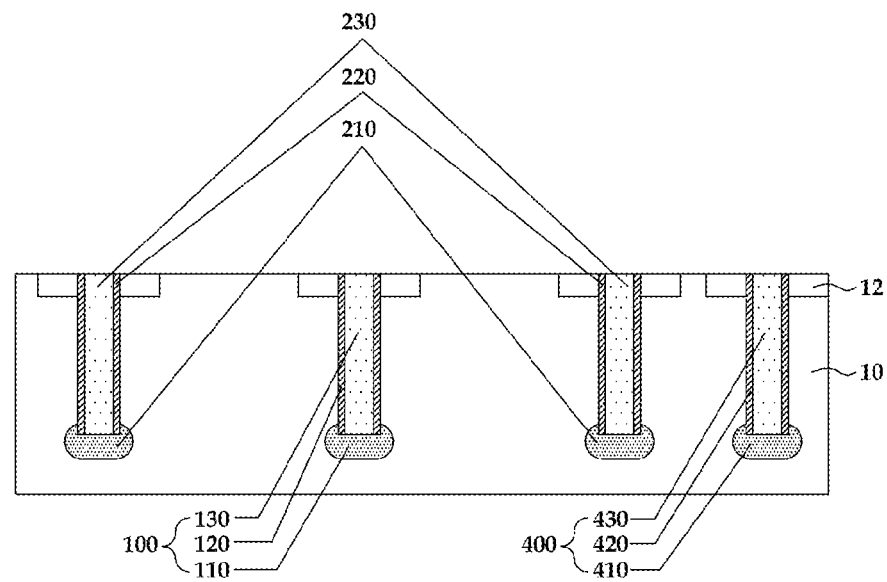

FIG. 11C does not illustrate an example in which the sensing terminal 300 is formed in a trench structure. However, a sensing trench of the sensing terminal is formed by using a supplementary trench mask in alternative examples.

Inside the trench configured as above, dopants such as Boron-11 ($B_{11}$) or Boron Fluoride ($BF_2$) ions are implanted to form P-type contact regions 110, 210 and 410. However, other appropriate ions are also used in other examples. For ease of explanation, the contact region situated inside the trench 100 is referred to as an input contact region 110. Each contact region situated inside the trenches of two ground terminals 200 is referred to as a ground contact region 210. A contact region situated inside the trench of the additional isolation structure 400 is referred to as a substrate contact region 410.

In these examples, the input contact region 110, two ground contact regions 210, and substrate contact region 410 are formed by implanting dopants at a concentration higher than that of the P-type substrate 10.

As illustrated in the example of FIG. 11C, insulating layers 120, 220 and 420 are disposed on the sidewalls of the trenches, but are not disposed at the bottom surface of the trench. This configuration is achieved by depositing a conformal oxide layer on the wafers, followed by an anisotropic dry etching, such as reactive-ion etching (RIE) plasma, for example, to selectively remove the conformal oxide layer at the bottom of the trenches. RIE uses chemically reactive plasma to remove material deposited on wafers. This technique for positioning the conformal oxide layer is often referred to as "spacer oxide formation". It is to be noted that the highly doped diffusions 110, 210 and 410 are also formed in other examples by using ion implantation and thermal annealing techniques after the formation of the sidewall layers. Inside the trench structure, which includes sidewall insulators and highly doped contact diffusions at the bottom, conductors 130, 230 and 430 are situated in some examples. For example, polysilicon having a low resistivity is used as the conductor. For this example, the polysilicon is in-situ doped with P-type dopants. In-situ doped means that the polysilicon is doped during deposition. Alternatively, undoped polysilicon is deposited and subsequently doped by ion implantation and is annealed or heated to diffuse the dopants within the polycrystalline layer. The conductors 130, 230 and 430 are formed using techniques such as an etchback process or a Chemical Mechanical Polishing (CMP) process as appropriate.

Figure 11D:
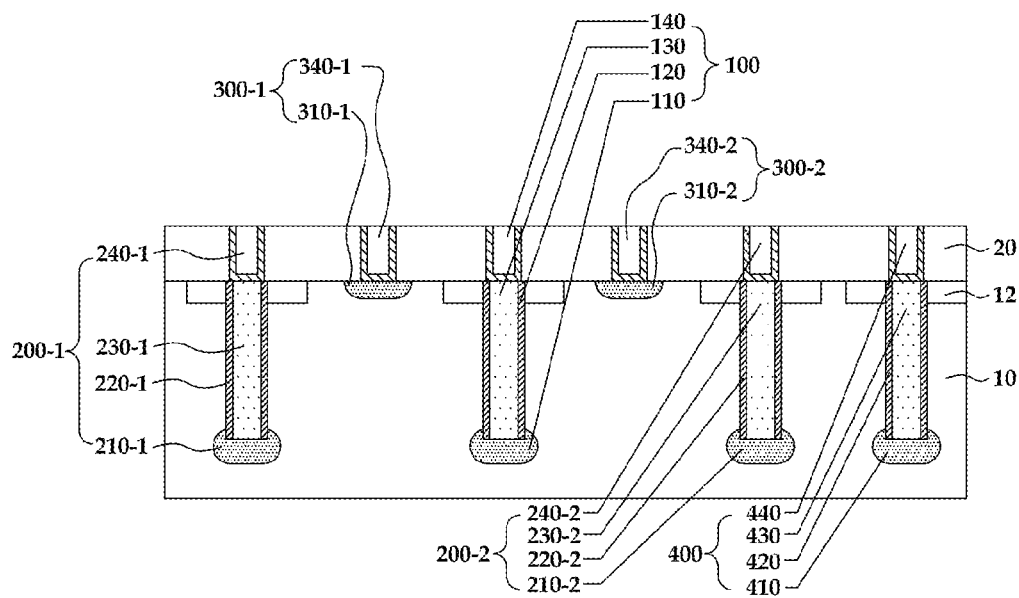

As illustrated in the example of FIG. 11D, between the input trench of the input terminal 100 and the ground trenches of the two ground terminals 200, P-type sensing contact regions 310 are disposed respectively. To create this structural arrangement, a supplementary mask process and an ion implantation process are potentially used.

Though not illustrated, after forming a deep trench structure, in an example, a gate and source/drain region are formed. Subsequently, on the substrate 10 or on the gate, an interlayer insulating layer 20 is possibly disposed, and contact plugs 140, 240, 340 and 440 are also possibly disposed to electrically connect each trench region or contact region inside the interlayer insulating layer 20. To form such a structure, an etching process using a supplementary mask process and a method of forming a contact plug inside the region etched by the etching process are used in various examples.

In the examples of FIGS. 11A, 11B, 11C, and 11D, a method is illustrated by which a sensing contact region of the sensing terminal is formed after forming a deep trench structure of the input terminal and two ground terminals. The formation of the sensing contact region, in these examples, is performed prior to the forming of the deep trench structure.

Though not illustrated, after the forming of the gate, deep trench structures 125, 225a, 225b and 425 are formed in some examples. For such examples, it is beneficial to reduce the number of mask steps for patterning. In such examples, after forming the gate, a deep trench is disposed and then an interlayer insulating layer 20 is disposed and contact plugs 140, 240, 340 and 440 for an electrical connection are formed with respect to each trench region or contact region inside the interlayer insulating layer 20.

FIGS. 12A, 12B, 12C, and 12D are diagrams illustrating an example of a method for manufacturing a vertical Hall sensor.

As illustrated in the example of FIG. 12A, a P-type substrate 10 is prepared as illustrated in the example of FIG. 11A. In some examples, the P-type substrate 10 includes a device isolation layer 12 such as a Shallow Trench Isolation (STI) or a local oxidation of silicon (LOCOS) oxide layer. The STI and the LOCOS are only examples, and are not intended to limit the particular forming process.

Further, inside the P-type substrate 10, an N-type well sensing region 15 is disposed. To form this structure, a supplementary mask process and a dopants ion implantation process is performed in the example of FIG. 12A. For example, dopants such as phosphorus (P) or arsenic (As) are implanted to form the sensing region. However, other appropriate dopants are used in other examples. Following the doping step, a thermal diffusion, such as at temperatures in the 800-1200° C. range, for a time period of 30 minutes up to many hours, is used to diffuse the dopants and anneal any ion implant damage.

As illustrated in the example of FIG. 12B, a trench mask 1 is disposed on a P-type substrate 10 in which the N-type sensing region 15 is formed. An input trench 125 and two ground trenches 225a and 225b are situated at a certain depth on the N-type sensing region, or alternatively on the P-type substrate. In some examples, at an outer region of the sensing region, a trench 425 is additionally formed to form an isolation structure in accordance with the above process.

FIG. 12B is a diagram illustrating an example of a structure in which an input trench 125 of an input terminal and ground trenches 225a and 225b of two ground terminals are situated at the same depth. In some other examples, the input trench 125 is situated at a depth different from that of the ground trenches 225a and 225b by using a supplementary trench mask.

Referring to FIG. 12B, an example in which the sensing terminal is provided in a trench structure is not illustrated. However, the sensing trench of the sensing terminal is formed by using a supplementary trench mask in other examples.

Inside the trench disposed inside the sensing region 15, N-type contact regions 115 and 215 are formed by implanting dopants such as phosphorus (P) or arsenic (As). However, other appropriate dopants are used in other examples. For ease of explanation, the contact region situated inside the trench is referred to as an input contact region, and each contact region situated inside the trenches of two ground terminals 200 is referred to as a ground contact region. Just as described above, the highly doped contact regions 115, 215 and 410 shown in FIG. 12B in some examples is formed after the sidewalls insulation is deposited inside the trenches.

In some examples, the input contact region and two ground contact regions are ion-implanted at a dopant concentration higher than that of the N-type sensing region 15.

Furthermore, separately, a P-type substrate contact region 410 is formed by implanting dopants such as Boron-11 ($B_{11}$) or Boron Fluoride ($BF_2$) ions in the trench in an example in which the above trench is not formed inside the sensing region 15.

Figure 12C:
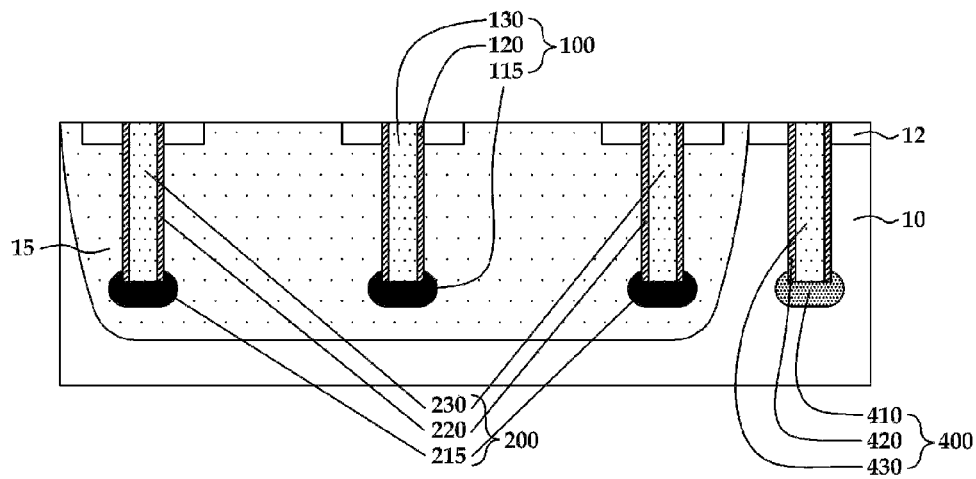

As illustrated in the example of FIG. 12C, on the sidewalls of the trench structure, insulating layers 120, 220 and 420 are deposited and the insulating layers are removed with respect to the bottom surface of the trench though the use of the "space etch" technique described above. Inside the trench structure, conductors 130, 230 and 430 are formed in some examples. In such an example, the conductors are polysilicon which is N+ doped for 100 and 200, and P+ doped for 400. Also, in examples, the conductors 130, 230 and 430 are formed by an etchback process or a Chemical Mechanical Polishing (CMP) process as appropriate.

Figure 12D:
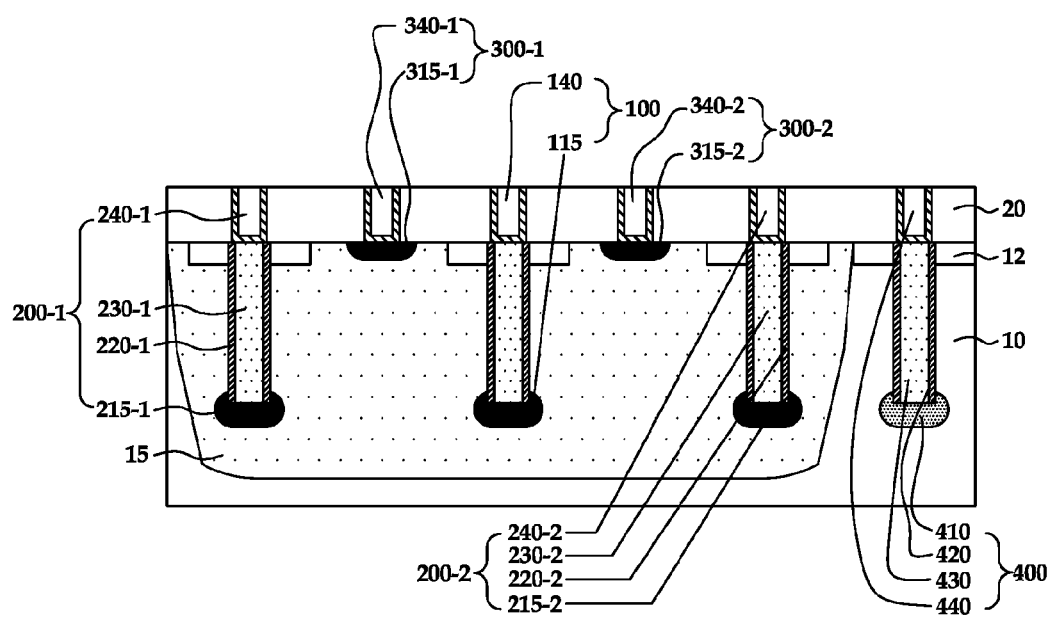

As illustrated in the example of FIG. 12D, between the input trench of the input terminal 100 and the ground trench of the two ground terminals 200, N-type sensing contact regions 315 are respectively formed. To this end, a supplementary mask process and an ion implantation process are used, as appropriate.

Subsequently, on the substrate, the interlayer insulating layer 20 is disposed in some examples. Contact plugs 140, 240, 340, and 440 are also potentially formed to electrically connect the respective trench regions or the contact regions inside the interlayer insulating layer 20. To this end, an etching process using a supplementary mask process and a method of forming a contact plug inside the region etched by the etching process are used, for example. As illustrated in the example of FIGS. 11A-11D, a deep trench structure is possibly formed before or after a gate is formed. Though not illustrated, formation of the high concentration buried layer having a second conductivity type inside the substrate is performed in some examples. The high concentration buried layer having a second conductivity type is possibly formed prior to the low concentration N-type sensing region 15 that has a second conductivity type.

According to examples, a trench structure is presented with respect to a contact structure for a detection of a magnetic force. On the sidewalls of the trenches in such a structure, an insulating layer is disposed thereby making it possible to minimize a vertical current component and to maximize a horizontal current component, in terms of a detection of the magnetic force.

Since the current path is formed to flow under the substrate surface, a magnitude of the magnetic field can be measured regardless of the state of the substrate surface.

Accordingly, the sensing accuracy for the detection of the magnetic force in examples is improved with respect to alternative devices and methods for a similar purpose.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

A computing system or a computer may include a microprocessor that is electrically connected to a bus, a user interface, and a memory controller, and may further include a flash memory device. The flash memory device may store N-bit data via the memory controller. The N-bit data may be data that has been processed and/or is to be processed by the microprocessor, and N may be an integer equal to or greater than 1. If the computing system or computer is a mobile device, a battery may be provided to supply power to operate the computing system or computer. It will be apparent to one of ordinary skill in the art that the computing system or computer may further include an application chipset, a camera image processor, a mobile Dynamic Random Access Memory (DRAM), and any other device known to one of ordinary skill in the art to be included in a computing system or computer. The memory controller and the flash memory device may constitute a solid-state drive or disk (SSD) that uses a non-volatile memory to store data.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A vertical Hall sensor comprising:
a first conductivity type substrate;
an input terminal comprising a first conductivity type input contact region situated inside the substrate, wherein the input contact region is electrically connected to an input power source;
a first ground terminal and a second ground terminal, each comprising trenches spaced apart from each other by an interval with the input terminal, an insulating layer disposed along sidewalls of the trenches, and a first conductivity type ground contact region situated at bottoms of the trenches and electrically connected to a ground power source; and
a first sensing terminal and a second sensing terminal, each comprising a first conductivity type sensing contact region, situated between the input terminal and the first ground terminal and between the input terminal and the second ground terminal in the substrate, respectively, wherein the sensing contact regions are configured to detect a Hall voltage.

2. The vertical Hall sensor of claim 1,
wherein the input terminal further comprises a trench having a depth, and a conductor formed inside the trench, and
wherein the input contact region is formed at a bottom of the trench of the input terminal.

3. The vertical Hall sensor of claim 2,
wherein a depth of the trench of the input terminal is equal to or less than that of the trenches of the first ground terminal and the second ground terminal.

4. The vertical Hall sensor of claim 1,
wherein the first sensing terminal and the second sensing terminal each further comprise a trench having a depth and an insulating layer disposed along sidewalls of the trench, and wherein the sensing contact regions of the first sensing terminal and the second sensing terminal are formed at bottoms of the trenches of the first sensing terminal and the second sensing terminal, respectively.

5. The vertical Hall sensor of claim 4,
wherein depths of the trenches of the first sensing terminal and the second sensing terminal are equal to or less than depths of the trenches of the first ground terminal and the second ground terminal.

6. The vertical Hall sensor of claim 1,
wherein the trenches of the first ground terminal and the second ground terminal are aligned in a ring structure.

7. The vertical Hall sensor of claim 1, further comprising:

an isolation ground ring surrounding peripheries of the first ground terminal and the second ground terminal.

8. The vertical Hall sensor of claim 1, further comprising:
an interlayer insulating layer disposed on the substrate, and
contact plugs electrically connected to the input contact region, the ground contact regions, and the sensing contact regions, respectively.

9. The vertical Hall sensor of claim 1, further comprising:
a first field isolation layer disposed between the input terminal and the first sensing terminal and the input terminal and the second sensing terminal; and
a second field isolation layer disposed between the first sensing terminal and the first ground terminal and the second sensing terminal and the second ground terminal.

10. The vertical Hall sensor of claim 1, further comprising:
a sensing region comprising a second conductivity type well disposed inside the substrate,
wherein the input contact region, the ground contact regions and the sensing contact regions are formed in the second conductivity type well sensing region.

11. The vertical Hall sensor of claim 1, further comprising:
a high concentration second conductivity type buried layer inside the substrate,
wherein the input contact region, the ground contact regions, and the sensing contact regions are formed in the high concentration second conductivity type buried layer.

12. The vertical Hall sensor of claim 1, wherein the vertical Hall sensor has a linear structure, a cross structure, or a bull's eye concentric round structure.

13. A vertical Hall sensor comprising:
a first conductivity type substrate;
an input terminal comprising a trench having a first depth, a conductor formed inside the trench, an insulating layer disposed along the sidewalls of the trench, and a first conductivity type input contact region situated at a bottom of the trench and electrically connected to an input power source;
a first ground terminal and a second ground terminal each comprising a trench having a second depth, an insulating layer disposed along the sidewalls of the trench, and a first conductivity type ground contact region situated at a bottom of the trench and electrically connected to a ground power source, wherein the trenches are spaced apart from each other by an interval with the input terminal being their center; and
a first sensing terminal and a second sensing terminal each comprising a trench having a third depth, an insulating layer disposed along the sidewalls of the trench, and a first conductivity type sensing contact region situated at a bottom of the trench, and configured to detect a Hall voltage.

14. A vertical Hall sensor of claim 13,
wherein the first depth, second depth, and third depth are the same depth.

15. A vertical Hall sensor of claim 13,
wherein the first depth is the same as the second depth, and greater than the third depth.

16. A vertical Hall sensor of claim 13,
wherein the third depth is greater than the first depth, and less than the second depth.

* * * * *